US009465473B2

(12) United States Patent
Lee et al.

(10) Patent No.: US 9,465,473 B2
(45) Date of Patent: Oct. 11, 2016

(54) ROLLABLE DISPLAY DEVICE

(71) Applicant: Samsung Display Co., Ltd., Yongin (KR)

(72) Inventors: Junghun Lee, Yongin (KR); Younjoon Kim, Yongin (KR); Jeonghwan Kim, Yongin (KR); Seungpeom Noh, Yongin (KR); Sangjo Lee, Yongin (KR); Jangdoo Lee, Yongin (KR); Patrick Jusuck Lee, Yongin (KR); Kyungmin Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/619,278

(22) Filed: Feb. 11, 2015

(65) Prior Publication Data

US 2016/0079329 A1    Mar. 17, 2016

(30) Foreign Application Priority Data

Sep. 16, 2014 (KR) ......................... 10-2014-0122931

(51) Int. Cl.
*H01L 27/32* (2006.01)
*H01L 51/52* (2006.01)
*G06F 3/041* (2006.01)
*G06F 1/16* (2006.01)
*H01L 51/00* (2006.01)
*G06F 3/044* (2006.01)

(52) U.S. Cl.
CPC ............ *G06F 3/0412* (2013.01); *G06F 1/1643* (2013.01); *G06F 1/1652* (2013.01); *G06F 3/044* (2013.01); *H01L 27/323* (2013.01); *H01L 27/3244* (2013.01); *H01L 51/0097* (2013.01); *H01L 51/524* (2013.01); *H01L 51/5253* (2013.01); *H01L 51/5281* (2013.01); *H01L 2251/5338* (2013.01)

(58) Field of Classification Search
CPC ....... H01L 27/32; H01L 51/56; H01L 51/52; H01L 51/00; H01L 51/524; H01L 51/5253; H01L 27/323; H01L 51/5281; H01L 51/0097; G06F 1/16; G06F 3/041; G06F 3/044
USPC ............................................... 257/40; 438/27
See application file for complete search history.

(56) References Cited

U.S. PATENT DOCUMENTS

| 9,276,055 B1* | 3/2016 | Son ..................... H01L 27/3276 |
| 2006/0007368 A1 | 1/2006 | Slikkerveer et al. |
| 2007/0216639 A1 | 9/2007 | LaFarre et al. |
| 2011/0187960 A1 | 8/2011 | Kobayashi et al. |
| 2012/0328800 A1 | 12/2012 | Yoon et al. |
| 2013/0127799 A1 | 5/2013 | Lee |
| 2013/0260120 A1 | 10/2013 | Hirayama et al. |

FOREIGN PATENT DOCUMENTS

| KR | 10-2011-0098692 | 12/2012 |
| KR | 10-2013-0055263 | 5/2013 |

* cited by examiner

*Primary Examiner* — Selim Ahmed
(74) *Attorney, Agent, or Firm* — H.C. Park & Associates, PLC

(57) ABSTRACT

A rollable display device including a roll frame and a flexible display unit windable in the roll frame, the flexible display unit includes a flexible substrate, a display layer disposed on the flexible substrate, an encapsulation layer respectively disposed on and configured to seal the display layer, a polarization layer, a touch screen layer, and a protection layer sequentially disposed on the encapsulation layer, and adhesive layers disposed between the encapsulation layer and the polarization layer, the polarization layer and the touch screen layer, and the touch screen layer and the protection layer, in which each of the adhesive layers comprise first regions and second regions alternately disposed between a first end and a second end of the flexible display unit, and a modulus of the first regions is different from a modulus of the second regions.

20 Claims, 4 Drawing Sheets

ROLLABLE DISPLAY DEVICE

CROSS-REFERENCE TO RELATED APPLICATION

This application claims from and the benefit of Korean Patent Application No. 10-2014-0122931, filed on Sep. 16, 2014, which is hereby incorporated by reference for all purposes as if fully set forth herein.

BACKGROUND

1. Field

Exemplary embodiments of the present invention relate to rollable display devices.

2. Discussion of the Background

With the advance of display-related technologies, research and development has been conducted to provide flexible display devices that may be bent or rolled. A rollable display device is a display device that may be rolled around a rod and unrolled during use.

However, when the rollable display device is rolled around the rod, stress may increase in the rollable display device as a distance between an end of the rollable display device and the central axis of the rod increases. The accumulated stress may cause layers formed in the rollable display device to peel off from an adhesive layer that adheres the layers to one another.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide rollable display devices capable of dispersing accumulated stress.

Additional aspects will be set forth in part in the description which follows and, in part, will be apparent from the description, or may be learned by practice of the inventive concept.

According to an exemplary embodiment of the present invention, a rollable display device may include a roll frame, and a flexible display unit windable in the roll frame, the flexible display unit including a flexible substrate, a display layer disposed on the flexible substrate, an encapsulation layer disposed on and configured to seal the display layer, a polarization layer, a touch screen layer, and a protection layer sequentially disposed on the encapsulation layer, and adhesive layers respectively disposed between the encapsulation layer and the polarization layer, the polarization layer and the touch screen layer, and the touch screen layer and the protection layer, in which each of the adhesive layers includes first regions and second regions alternately disposed between a first end and a second end of the flexible display unit, and a modulus of the first regions is different from a modulus of the second regions.

The first end of the flexible display device may be connected to the roll frame, and the second end of the flexible display device may be opposite to the first end in a direction extending away from the roll frame.

The first regions and the second regions may be disposed along a longitudinal direction of the roll frame.

The modulus of the first regions may be larger than the modulus of the second regions, and the first regions may be disposed at the first end and the second end of the flexible display unit.

An area of each of the second regions may gradually increase from the first end to the second end of the flexible display unit.

An area of each of the second regions may gradually increase from the first end to the second end of the flexible display unit.

The first regions and the second regions may be convex towards the second end of the flexible display unit.

Curvature radii of the first regions and the second regions may gradually decreases from the first end to the second end of the flexible display unit.

The rollable display device may further include third regions disposed between the first regions and the second regions.

A modulus of the third regions may have a value between the modulus of the first regions and the modulus of the second regions.

The first regions and the second regions may include the same adhesive comprising cross-linking agents, and a number of bonds of the cross-linking agents is larger in the first regions than in the second regions.

The display layer may include an organic light-emitting device and a thin film transistor electrically connected to the organic light-emitting device.

The polarization layer may include a phase difference film and a polarization film.

The touch screen layer may be a capacitive touch screen layer.

The encapsulation layer may include alternately stacked organic films and inorganic films.

According to an exemplary embodiment of the present invention, a method of forming a flexible display unit for a rollable display device may include disposing a display layer on a flexible substrate, disposing an encapsulation layer on the display layer to seal the display layer, disposing a polarization layer, a touch screen layer, a protection layer sequentially on the encapsulation layer, forming a pattern including first regions and second regions alternately disposed on an adhesive layer, and disposing adhesive layers respectively between the encapsulation layer and the polarization layer, the polarization layer and the touch screen layer, and the touch screen layer and the protection layer, in which the first regions and the second regions have different moduli from each other.

The forming of the pattern may further include disposing a first adhesive on regions corresponding to the first regions of the adhesive layer, the first adhesive including at least one of an epoxy group, a phenoxy group, and an oxetane group, and disposing a second adhesive on regions corresponding to the second regions of the adhesive layer, the second adhesive including at least one of a urethane-based, a urethane-modified-based adhesive, a silicon-based adhesive, and a silicon-modified-based adhesive, in which a modulus of the first regions is larger than a modulus of the second regions.

The forming of the pattern may further include disposing an adhesive including cross-linking agents on the entire adhesive layer, and patterning portions of the adhesive layer corresponding to the second regions to break the bonds of the cross-linking agents.

The patterning portions of the adhesive layer may include using at least one of plasma and corona discharge.

The first regions are disposed at a first end of the flexible display unit connected to a roll frame and second end of the flexible display unit opposite to the first end.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
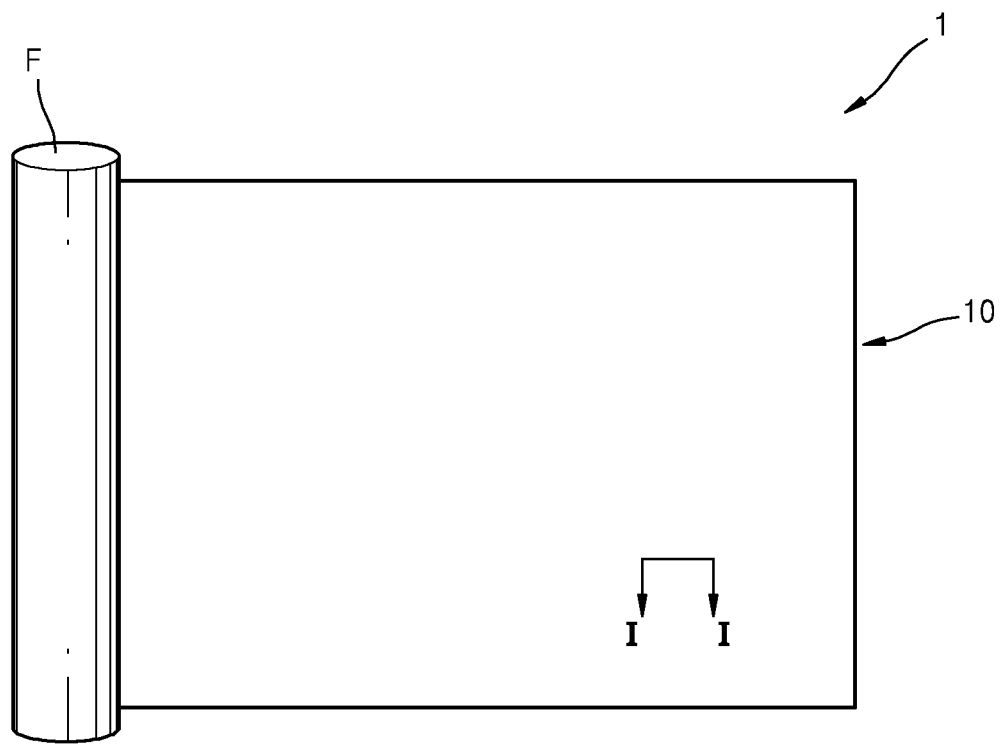
FIG. 1 is a schematic plan view of a rollable display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
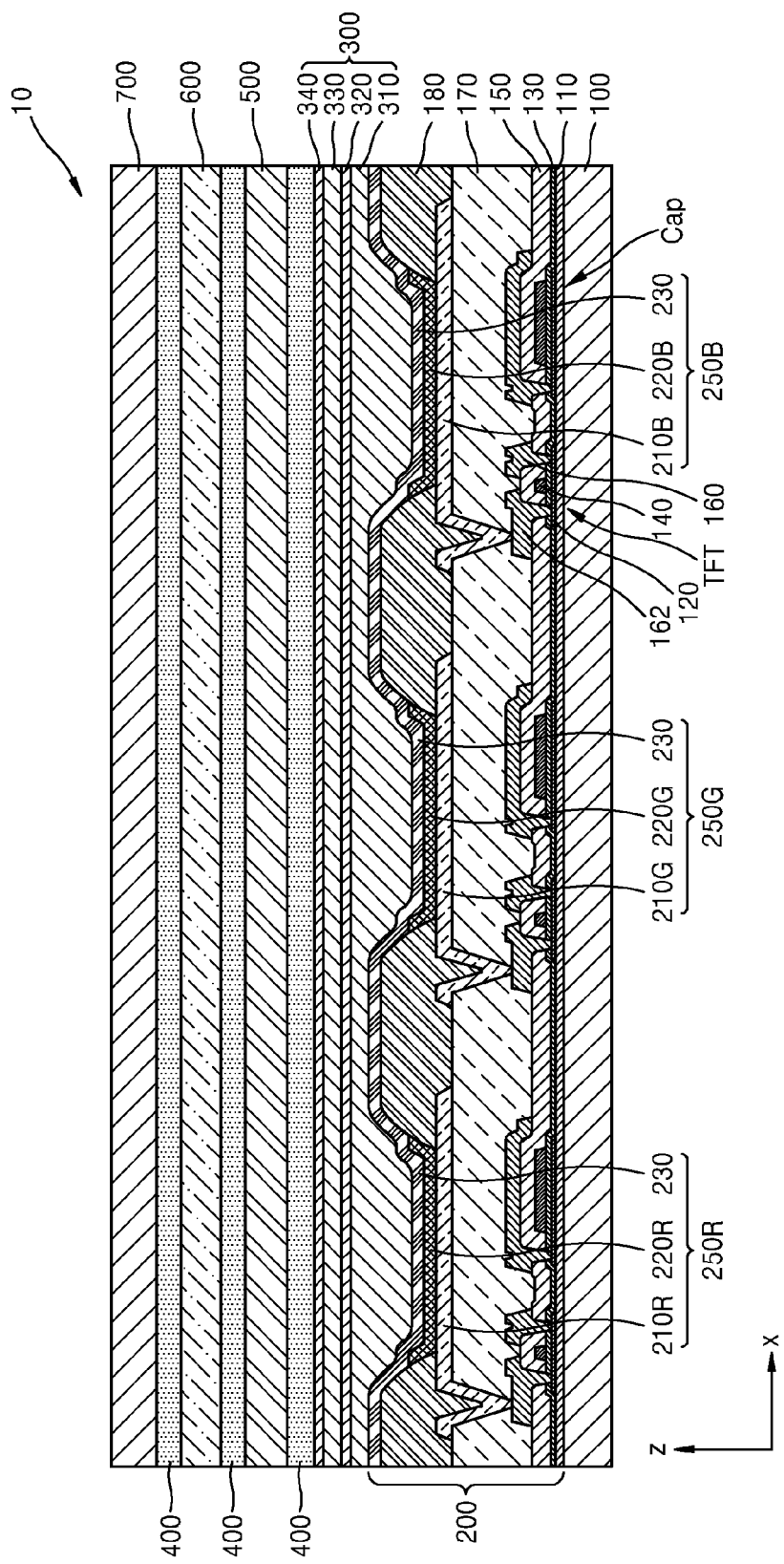
FIG. 2 is a schematic cross-sectional view taken along line I-I of FIG. 1.
Figure 3:
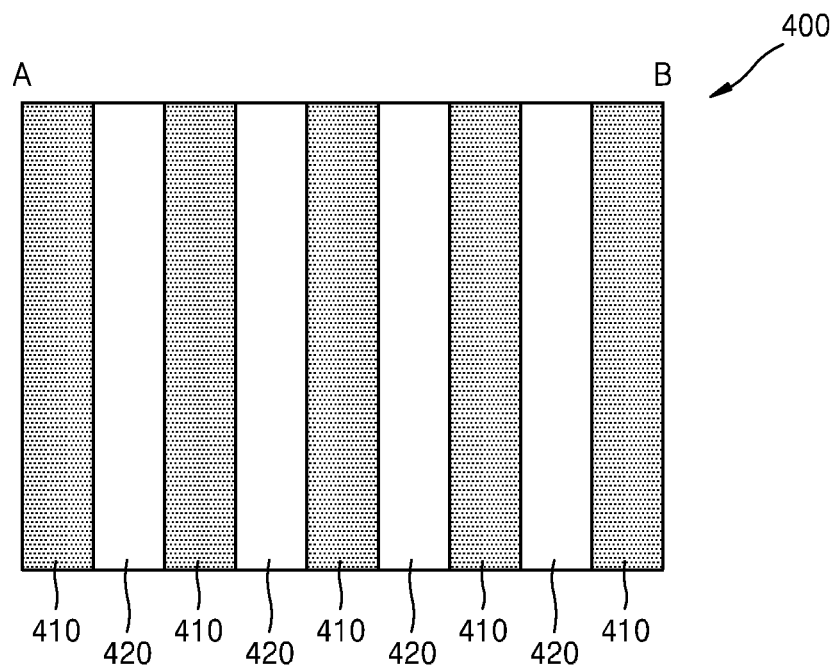
FIG. 3 is a schematic plan view of an adhesive layer of the rollable display device of FIG. 1.

FIG. 1 is a schematic plan view of a rollable display device 1, according to an exemplary embodiment of the present invention. FIG. 2 is a schematic cross-sectional view taken along line I-I of FIG. 1. FIG. 3 is a schematic plan view of an adhesive layer of the rollable display device 1 of FIG. 1.

Referring to FIGS. 1 to 3, the rollable display device 1 according to the present exemplary embodiment may include a roll frame F and a flexible display unit 10 windable in the roll frame F.

Referring to FIG. 1, the roll frame F may include a rod (not shown) disposed inside. The rod may be coupled to a first end of the flexible display unit 10, and the flexible display unit 10 may be rolled around the rod.

Referring to FIG. 2, the flexible display unit 10 may include a flexible substrate 100, a display layer 200 disposed on the flexible substrate 100, and an encapsulation layer 300 that seals the display layer 200. The flexible display unit 10 may further include a polarization layer 500, a touch screen layer 600, and a protection layer 700, which are sequentially formed on the encapsulation layer 300. Furthermore, the flexible display unit 10 may include adhesive layers 400 disposed between the encapsulation layer 300 and the polarization layer 500, the polarization layer 500 and the touch screen layer 600, and the touch screen layer 600 and the protection layer 700.

The flexible substrate 100 may have a flexible characteristic and include a metal or a plastic material, such as polyethylene terephthalate (PET), polyethylene naphthalate (PEN), and polyimide. The flexible substrate 100 may further include a thin metal foil, such as a steel use stainless (SUS).

Referring to FIG. 3, the display layer 200 may include a thin film transistor TFT, a capacitor Cap, and an organic light-emitting device electrically connected to the thin film transistor TFT.

The thin film transistor TFT may include a semiconductor layer 120, a gate electrode 140, a source electrode 160, and a drain electrode 162. The semiconductor layer 120 may include amorphous silicon, polycrystalline silicon, or an organic semiconductor material. Hereinafter, a structure of the thin film transistor TFT will be described below.

A buffer layer 110 including silicon oxide or silicon nitride may be disposed on the flexible substrate 100, and the semiconductor layer 120 may be disposed on the buffer layer 110. The buffer layer 110 may planarize the surface of the flexible substrate 100 or prevent impurities from penetrating into the semiconductor layer 120 of the thin film transistor TFT.

The gate electrode 140 is disposed on the semiconductor layer 120. Based on a signal applied to the gate electrode 140, the source electrode 160 and the drain electrode 162 may be electrically connected to each other. By taking into account factors such as an adhesiveness to an adjacent layer, surface flatness of a stacked layer, and processability, the gate electrode 140 may be a monolayer or a multi-layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A gate insulating film 130 including silicon oxide and/or silicon nitride may be disposed between the semiconductor layer 120 and the gate electrode 140 to secure insulating properties between the semiconductor layer 120 and the gate electrode 140.

An interlayer insulating film 150 may be disposed on the gate electrode 140. An interlayer insulating film 150 may be a monolayer or a multi-layer including silicon oxide or silicon nitride.

The source electrode 160 and the drain electrode 162 may be disposed on the interlayer insulating film 150. The source electrode 160 and the drain electrode 162 may be electrically connected to the semiconductor layer 120 through contact holes formed in the interlayer insulating film 150 and the gate insulating film 130, respectively.

Each of the source electrode 160 and the drain electrode 162 may be a monolayer or a multi-layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A first insulating film 170 may be disposed on the source electrode 160 and the drain electrode 162. When the organic light-emitting device is disposed on the thin film transistor TFT, the first insulating film 170 may planarize the top surface of the thin film transistor TFT and protect the thin film transistor TFT and other elements. The first insulating film 170 may include an acryl-based organic material or benzocyclobutene (BCB).

A second insulating film 180 may be disposed on the thin film transistor TFT. The second insulating film 180 may be a pixel defining film. The second insulating film 180 may be disposed on the first insulating film 170 and may have an opening. The second insulating film 180 may define a pixel region on the flexible substrate 100.

The second insulating film 180 may include an organic insulating film. The organic insulating film may include at least one of an acryl-based polymer such as polymethyl methacrylate (PMMA), a polystyrene (PS), a polymer derivative having a phenol group, an imide-based polymer, an arylether-based polymer, an amide-based polymer, a fluorine-based polymer, a p-xylene-based polymer, a vinyl-alcohol-based polymer, and mixtures thereof.

Organic light-emitting devices may be disposed on the second insulating film 180 to form a red subpixel 250R, a green subpixel 250G, and a blue subpixel 250B, respectively. The red subpixel 250R may include a pixel electrode 210R, an intermediate layer 220R, and an opposite electrode 230, and emit red light. The green subpixel 250G may include a pixel electrode 210G, an intermediate layer 220G, and an opposite electrode 230, and emit green light. The blue subpixel 250B may include a pixel electrode 210B, an intermediate layer 220B, and an opposite electrode 230, and emit blue light. The opposite electrodes 230 may be disposed on the entire surface of the flexible substrate 100.

The pixel electrodes 210R, 210G, and 210B may be connected to the thin film transistors TFT, respectively, and may be formed as transparent electrodes or reflective electrodes. When the pixel electrodes 210R, 210G, and 210B are formed as transparent electrodes, the pixel electrodes 210R, 210G, and 210B may include indium tin oxide (ITO), indium zinc oxide (IZO), zinc oxide (ZnO), indium oxide ($In_2O_3$), indium gallium oxide (IGO), or aluminum zinc oxide (AZO). When the pixel electrodes 210R, 210G, and 210B are formed as reflective electrodes, the pixel electrodes 210R, 210G, and 210B may include a reflection film formed of at least one of silver (Ag), magnesium (Mg), aluminum (Al), platinum (Pt), palladium (Pd), gold (Au), nickel (Ni), neodymium (Nd), iridium (Ir), chromium (Cr), and alloys thereof, and a layer formed of at least one of indium tin oxide (ITO), indium zinc oxide (IZO), zinc oxide (ZnO), indium oxide (In$_2$O$_3$), indium gallium oxide (IGO), and aluminum zinc oxide (AZO). Each of the pixel electrodes 210R, 210G, and 210B may have a single layer or a layer stack structure.

In the pixel region defined by the second insulating film 180, an intermediate layer 220R for emitting red light, an intermediate layer 220G for emitting green light, and an intermediate layer 220B for emitting blue light may be disposed for the red subpixel 250R, the green subpixel 250G, and the blue subpixel 250B, respectively. The intermediate layers 220R, 220G, and 220B may include emission layers (EML) that emit red light, green light, and blue light, respectively. In addition to the emission layers (EML), a hole injection layer (HIL) and a hole transport layer (HTL) disposed between the emission layer (EML) and the pixel electrodes 210R, 210G, and 210B, and an electron transport layer (ETL) and an electron injection layer (EIL) disposed between the emission layer (EML) and the opposite electrode 230, may be stacked in a single or multi-layer structure.

The opposite electrodes 230, which cover the intermediate layers 220R, 220G, and 220B including the emission layer (EML) and face the pixel electrodes 210R, 210G, and 210B, may be disposed on the entire surface of the flexible substrate 100. The opposite electrodes 230 may be formed as transparent electrodes or reflective electrodes.

When the opposite electrodes 230 are formed as transparent electrodes, the opposite electrodes 230 may include a layer formed of a metal having a small work function, for example, Li, Ca, LiF/Ca, LiF/Al, Al, Ag, Mg, and compounds thereof, and a transparent conductive layer formed of ITO, IZO, ZnO, or In$_2$O$_3$. When the opposite electrodes 230 are formed as reflective electrodes, the opposite electrodes 230 may include a layer formed of at least one of Li, Ca, LiF/Ca, LiF/Al, Al, Ag, Mg, and compound thereof.

The encapsulation layer 300 may seal the display layer 200 to prevent external oxygen and moisture from penetrating into the display layer 200. The encapsulation layer 300 may have a multi-layer structure of alternately stacked organic films 310 and 330 and inorganic films 320 and 340.

The organic films 310 and 330 may include at least one of an acryl-based resin, a methacryl-based resin, a polyisoprene-based resin, a vinyl-based resin, an epoxy-based resin, a urethane-based resin, a cellulose-based resin, and a perylene-based resin.

The inorganic films 320 and 340 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The polarization layer 500, the touch screen layer 600, and the protection layer 700 may be sequentially disposed on the encapsulation layer 300.

The polarization layer 500 may transmit light polarized in the same direction as a polarization axis among light emitted from the display layer 200, and absorb or reflect the remaining light. The polarization layer 500 may include a phase difference film and a polarization film. The phase difference film converts linearly polarized light into circularly polarized light by giving a phase difference of λ/4 to two polarization components perpendicular to each other. The polarization film may align directions of light passing through the phase difference film, divide the light into two polarization components perpendicular to each other, transmit one of the two polarization components, and absorb or reflect the other polarization component.

The touch screen layer 600 may include a touch sensor in which first electrodes and second electrodes are disposed to intersect each other. The touch sensor may be a capacitive touch sensor that determines the occurrence of a touch in a relevant region by detecting a capacitance change generated in the first electrodes and the second electrodes disposed to intersect one another.

The protection layer 700 may protect the display layer 200 from external shock. The protection layer 700 may include at least one of polyethylene terephthalate (PET), polystyrene (PS), polyethylene naphthalate (PEN), polyestersulfone (PES), and polyethylene (PE).

The adhesive layers 400 may be disposed between the encapsulation layer 300 and the polarization layer 500, between the polarization layer 500 and the touch screen layer 600, and between the touch screen layer 600 and the protection layer 700, to respectively adhere each other.

Each of the adhesive layers 400 may include first regions 410 and second regions 420 that are alternately disposed between a first end A and a second end B of the flexible display unit 10. The first end A of the flexible display unit 10 may be a side connected to the roll frame F, and the second end B of the flexible display unit 10 may be a side opposite to the first end A thereof. The first regions 410 and the second regions 420 may be formed along a longitudinal direction of the roll frame F.

The first regions 410 and the second regions 420 may have a different modulus. For example, the modulus of the first regions 410 may be larger than the modulus of the second regions 420.

The first regions 410 having a large modulus may have a high adhesive strength and high restoring force, and the second regions 420 having a small modulus may have a high elongation rate. Therefore, when the flexible display unit 10 is rolled while maintaining a bonding force among the encapsulation layer 300, the polarization layer 500, the touch screen layer 600, and the protection layer 700, the second regions 420 may disperse stress accumulated in the first end A to the second end B of the flexible display unit 10.

Because the least amount of stress may occur in the first end A of the flexible display unit 10, the first regions 410 may be formed in the first end A of the flexible display unit 10. The first regions 410 may also be formed in the second end B of the flexible display unit 10 to prevent the flexible display unit 10 from being deformed due to shifting of the adhesive layers 400.

The first regions 410 and the second regions 420 may be formed by coating adhesives at corresponding areas thereof.

The first regions 410 may be formed by using an adhesive having a relatively low elasticity. The elongation rate of the first regions 410 after curing may be in the range of about 0% to about 100%, and the first regions 410 may be formed by using an adhesive having an epoxy group, a phenoxy group, or an oxetane group.

The second regions 420 may be formed by using an adhesive having a high elasticity. The elongation rate of the second regions 420 after curing may be in the range of about 150% to about 1,000%, and the second regions 420 may be formed by using a urethane-based adhesive, a urethane-modified-based adhesive, a silicon-based adhesive, or a silicon-modified-based adhesive.

According to the present exemplary embodiment, the first regions 410 and the second regions 420 may be formed by coating an adhesive of the same material on the entire adhesive layer 400, and patterning the coated adhesive in respective regions by using plasma or corona discharge.

The plasma or the corona discharge patterning may break the bonds of cross-linking agents included in the adhesive of the patterned portions. Accordingly, the patterned portions may become the second regions 420 having a small modulus.

The modulus of the first regions 410 may be equal to or greater than 4 Kgf/cm$^2$, and the modulus of the second regions 420 may be less than or equal to 2 Kgf/cm$^2$. The moduli of the first regions 410 and the second regions 420, and the areas of the first regions 410 and the second regions 420 may be determined in consideration of the curvature radius of the rollable display device 1 and the size of the flexible display unit 10.

Figure 4:
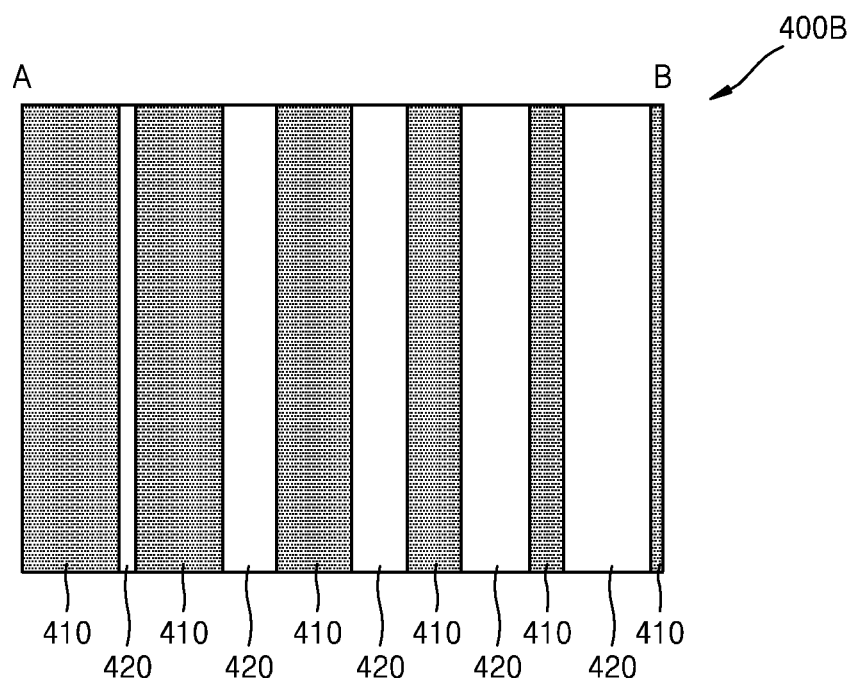
FIG. 4 is a schematic plan view of the adhesive layer of FIG. 3 according to an exemplary embodiment of the present invention.

FIG. 4 is a schematic plan view of the adhesive layer of FIG. 3 according to an exemplary embodiment of the present invention.

Referring to FIGS. 1, 2, and 4, an adhesive layer 400B may include first regions 410 and second regions 420 that are alternately disposed between a first end A and a second end B of the flexible display unit 10. The first regions 410 and the second regions 420 may be formed along a longitudinal direction of the roll frame F.

The modulus of the first regions 410 may be larger than the modulus of the second regions 420. The first regions 410 may be formed at the first end A and the second end B of the flexible display unit 10. The area of the first regions 410 may be gradually reduced from the first end A to the second end B of the flexible display unit 10. Accordingly, the area of the second regions 420 may be gradually increased from the first end A to the second end B of the flexible display unit 10.

Therefore, when the flexible display unit 10 is rolled, accumulated stress may be dispersed from the first end A to the second end B of the flexible display unit 10.

The areas of the first regions 410 and the second regions 420 may be set in consideration of the curvature radius of the rollable display device 1 and the size of the flexible display unit 10.

Figure 5:
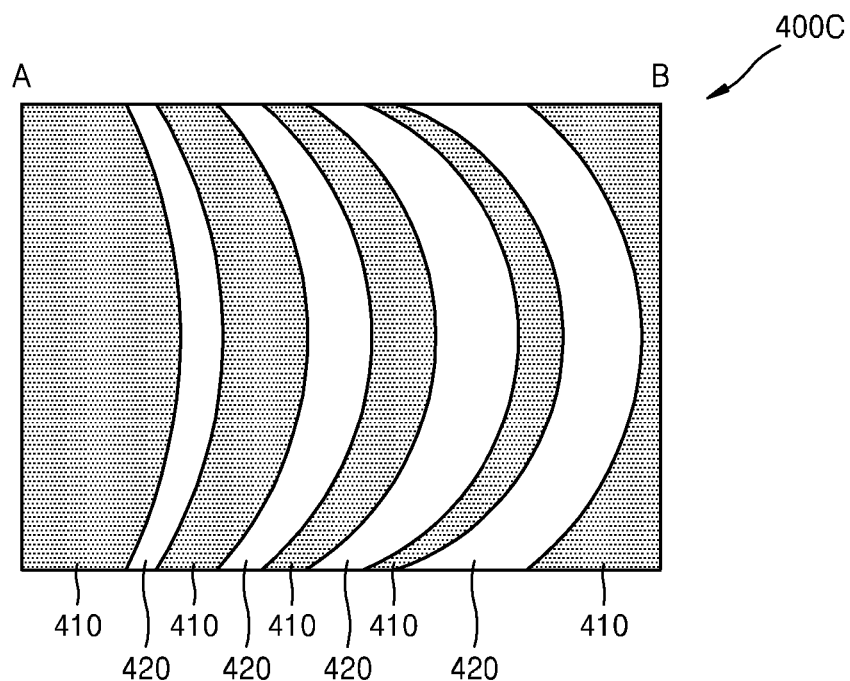
FIG. 5 is a schematic plan view of the adhesive layer of FIG. 3 according to an exemplary embodiment of the present invention.

FIG. 5 is a schematic plan view of the adhesive layer of FIG. 3 according to an exemplary embodiment of the present invention.

Referring to FIGS. 1, 2, and 5, an adhesive layer 400C may include first regions 410 and second regions 420 that are alternately disposed between a first end A and a second end B of the flexible display unit 10.

A modulus of the first regions 410 may be larger than a modulus of the second regions 420. The area of the second regions 420 may be gradually increased from the first end A to the second end B of the flexible display unit 10.

The first regions 410 and the second regions 420 may be formed along a longitudinal direction of the roll frame F, and be convex toward the second end B of the flexible display unit 10. The curvature radii of the first region 410 and the second regions 420 may be gradually reduced from the first end A to the second end B of the flexible display unit 10.

Patterns of the first regions 410 and the second regions 420 according to the present exemplary embodiment may disperse the stress radially accumulated from the center to the second end B of the flexible display unit 10.

Figure 6:
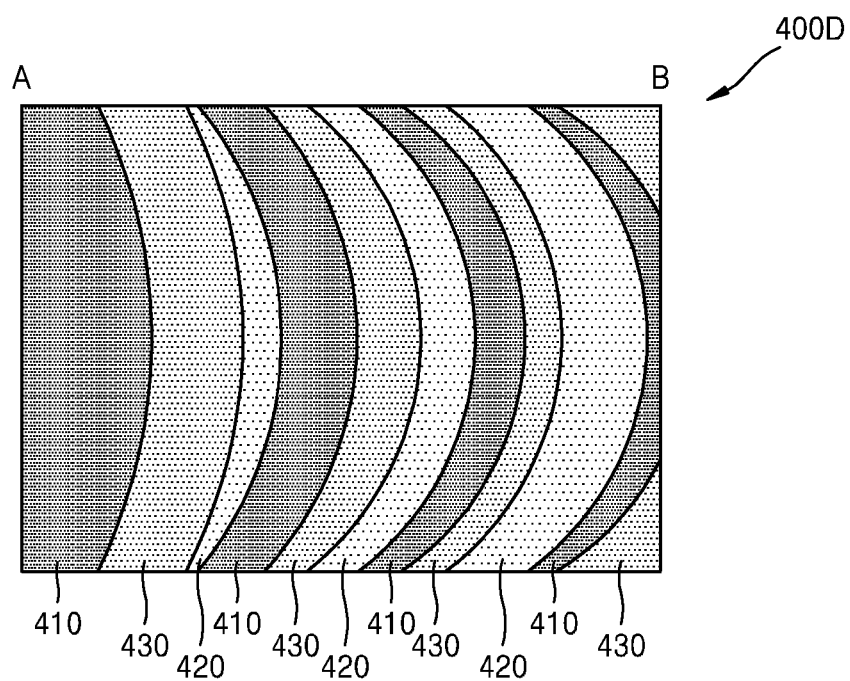
FIG. 6 is a schematic plan view of the adhesive layer of FIG. 3 according to an exemplary embodiment of the present invention.

FIG. 6 is a schematic plan view of the adhesive layer of FIG. 3 according to an exemplary embodiment of the present invention.

Referring to FIGS. 1, 2, and 6, an adhesive layer 400D may include first regions 410, second regions 420, and third regions 430 that are alternately disposed between a first end A and a second end B of the flexible display unit 10.

The area of the first regions 410 may be gradually reduced from the first end A to the second end B of the flexible display unit 10, and the area of the second regions 420 may be gradually increased from the first end A to the second end B of the flexible display unit 10.

The sequence of the first regions 410, second regions 420, and third regions 430 in the adhesive layer 400D may have various arrangements. In addition, the third regions 430 may be included in the adhesive layer 400 of FIG. 3, the adhesive layer 400B of FIG. 4 and the adhesive layer 400C of FIG. 5.

The modulus of the third regions 430 may have a value between the modulus of the first regions 410 and the second regions 420. Accordingly, the third regions 430 may smoothen a rapid modulus change between the first regions 410 and the second regions 420, thus the adhesive layer 400D may maintain the adhesive force and achieve more efficient dispersion of stress.

The areas of the first regions 410, the second regions 420, and the third regions 430 may be set in consideration of the curvature radius of the rollable display device 1 and the size of the flexible display unit 10.

As described above, according to the one or more of the exemplary embodiments of the present invention, damage to the rollable display device from the accumulation of stress may be prevented by dispersing the accumulated stress of the rollable display device.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A rollable display device, comprising:
   a roll frame; and
   a flexible display unit windable in the roll frame, the flexible display unit comprising:
      a flexible substrate;
      a display layer disposed on the flexible substrate;
      an encapsulation layer disposed on and configured to seal the display layer;
      a polarization layer, a touch screen layer, and a protection layer sequentially disposed on the encapsulation layer; and
      adhesive layers respectively disposed between the encapsulation layer and the polarization layer, the polarization layer and the touch screen layer, and the touch screen layer and the protection layer, wherein:
      each of the adhesive layers comprises first regions and second regions alternately disposed between a first end and a second end of the flexible display unit; and
      a modulus of the first regions is different from a modulus of the second regions.

2. The rollable display device of claim 1, wherein:
   the first end of the flexible display device is connected to the roll frame; and
   the second end of the flexible display device is opposite to the first end in a direction extending away from the roll frame.

3. The rollable display device of claim 2, wherein the first regions and the second regions are disposed along a longitudinal direction of the roll frame.

4. The rollable display device of claim 3, wherein:
   the modulus of the first regions is larger than the modulus of the second regions; and
   the first regions are disposed at the first end and the second end of the flexible display unit.

5. The rollable display device of claim 3, wherein an area of each of the first regions gradually reduces from the first end to the second end of the flexible display unit.

6. The rollable display device of claim 3, wherein an area of each of the second regions gradually increases from the first end to the second end of the flexible display unit.

7. The rollable display device of claim 3, wherein the first regions and the second regions are convex towards the second end of the flexible display unit.

8. The rollable display device of claim 7, wherein curvature radii of the first regions and the second regions gradually decreases from the first end to the second end of the flexible display unit.

9. The rollable display device of claim 3, further comprising third regions disposed between the first regions and the second regions.

10. The rollable display device of claim 9, wherein a modulus of the third regions comprises a value between the modulus of the first regions and the modulus of the second regions.

11. The rollable display device of claim 1, wherein:
the first regions and the second regions comprise the same adhesive comprising cross-linking agents; and
a number of bonds of the cross-linking agents is larger in the first regions than in the second regions.

12. The rollable display device of claim 1, wherein the display layer comprises an organic light-emitting device and a thin film transistor electrically connected to the organic light-emitting device.

13. The rollable display device of claim 1, wherein the polarization layer comprises a phase difference film and a polarization film.

14. The rollable display device of claim 1, wherein the touch screen layer comprises a capacitive touch screen layer.

15. The rollable display device of claim 1, wherein the encapsulation layer comprises alternately stacked organic films and inorganic films.

16. A method of forming a flexible display unit for a rollable display device, the method comprising:
disposing a display layer on a flexible substrate;
disposing an encapsulation layer on the display layer to seal the display layer;
disposing a polarization layer, a touch screen layer, a protection layer sequentially on the encapsulation layer;
forming a pattern comprising first regions and second regions alternately disposed on an adhesive layer; and
disposing adhesive layers respectively between the encapsulation layer and the polarization layer, the polarization layer and the touch screen layer, and the touch screen layer and the protection layer, wherein:
the first regions and the second regions have different moduli from each other.

17. A method of claim 16, wherein forming the pattern further comprises:
disposing a first adhesive on regions corresponding to the first regions of the adhesive layer, the first adhesive comprising at least one of an epoxy group, a phenoxy group, and an oxetane group; and
disposing a second adhesive on regions corresponding to the second regions of the adhesive layer, the second adhesive comprising at least one of a urethane-based, a urethane-modified-based adhesive, a silicon-based adhesive, and a silicon-modified-based adhesive, wherein a modulus of the first regions is larger than a modulus of the second regions.

18. The method of claim 16, wherein forming the pattern further comprises:
disposing an adhesive comprising cross-linking agents on the entire adhesive layer; and
patterning portions of the adhesive layer corresponding to the second regions to break the bonds of the cross-linking agents.

19. The method of claim 18, wherein patterning portions of the adhesive layer comprises using at least one of plasma and corona discharge.

20. The method of claim 16, wherein:
the first regions are disposed at a first end of the flexible display unit connected to a roll frame and second end of the flexible display unit opposite to the first end.

* * * * *